United States Patent
Nakajima

(10) Patent No.: US 6,611,571 B1
(45) Date of Patent: Aug. 26, 2003

(54) APPARATUS AND METHOD FOR DEMODULATING AN ANGLE-MODULATED SIGNAL

(75) Inventor: Michio Nakajima, Osaka (JP)

(73) Assignee: Icom Incorporated, Osaka (JP)

( * ) Notice: Subject to any disclaimer, the term of this patent is extended or adjusted under 35 U.S.C. 154(b) by 0 days.

(21) Appl. No.: 09/322,798

(22) Filed: May 28, 1999

(30) Foreign Application Priority Data

Jun. 16, 1998 (JP) .......................................... 10-168150

(51) Int. Cl.$^7$ .............................................. H04L 27/22

(52) U.S. Cl. ........................ 375/327; 329/315; 329/345

(58) Field of Search ................................ 375/316, 322, 375/224, 327, 340; 329/345, 346, 315

(56) References Cited

U.S. PATENT DOCUMENTS

| | | | | |
|---|---|---|---|---|
| 5,303,269 A | * | 4/1994 | Altes ............................ | 330/252 |
| 5,568,098 A | * | 10/1996 | Horie et al. ................. | 327/105 |
| 5,732,068 A | * | 3/1998 | Takahashi et al. ........... | 370/206 |
| 5,832,043 A | * | 11/1998 | Eory ........................... | 375/344 |
| 5,857,003 A | * | 1/1999 | Geiger et al. ................ | 375/319 |

FOREIGN PATENT DOCUMENTS

JP 63-288504 11/1988

* cited by examiner

Primary Examiner—Amanda T. Le
(74) Attorney, Agent, or Firm—Frishauf, Holtz, Goodman & Chick, P.C.

(57) ABSTRACT

An angle demodulator in which an FM modulated wave is converted into an IF signal (SI) in the form of digital so as the signal is supplied to a Hilbert transformer (81) and to an outer product calculation section (82). The Hilbert transformer (81) allows the phase of the IF signal (SI) to shift ninety degrees and supplied it to the outer product calculation section (82). An integrator (84) calculates a phase of a cosine wave of an angular frequency that a frequency control unit (83) designates. A phase converter (85) calculates the cosine wave and an instantaneous value of a signal in which the cosine wave shifts ninety degrees out of phase so as to supply the value to the outer product calculation section (82). The outer product calculation section (82) supplies to the frequency control unit (83) an outer product of a vector including a value of the IF signal and of a signal from the Hilbert transformer (81) and a vector including a value supplied from the phase converter (85). The frequency control unit (83) performs a proportion integral control to the outer product so as to determine an updated value of an angular frequency, and supplies the determined value to the integrator (84). A digital signal representing the value of the angular frequency is converted into an analog signal as a result of D/A conversion and is reproduced as a voice.

18 Claims, 5 Drawing Sheets

APPARATUS AND METHOD FOR DEMODULATING AN ANGLE-MODULATED SIGNAL

BACKGROUND OF THE INVENTION

1. Field of the Invention

The present invention relates to an apparatus and method for accurately demodulating a deeply angle-modulated signal.

2. Description of the Related Art

An apparatus and method of demodulating an angle-modulated wave with using analog signal processing has been employed. In recent years, a method of demodulating an angle-modulated wave with using digital signal processing has been widely proposed according as a digital signal processing technique develops.

A conventional angle demodulator, with digital signal processing, is composed of an FM demodulator in which an FM signal is demodulated by applying the FM signal and a signal whose phase has shifted ninety degrees with respect to that of the FM signal.

The FM demodulator demodulates the FM signal based on equation (1) where X represents the FM signal to be demodulated and Y represents a signal whose phase advances ninety degrees with respect to the FM signal, and F represents a result of the FM signal being demodulated.

$$F=(d/dt)\arctan(X/Y) \quad (1)$$

As illustrated in FIG. 5, the FM demodulator comprises, for example, an A/D converter 101, a delay compensator 102, a ninety-degree phase shifter 103, a phase angle calculator 104, a differentiator 105 and a D/A converter 106.

In this type of FM demodulator, the FM signal X is input to the A/D converter 101 so as to be converted into a digital signal. This digital signal is input both to the delay compensator 102 and to the ninety-degree phase shifter 103.

The ninety-degree phase shifter 103 generates a digital signal representing a signal Y whose phase shifts ninety degrees with respect to phase of the input digital signal, and outputs the phase-advanced digital signal to the phase angle calculator 104. The delay compensator 102 delays the input digital signal for a time period of a delay which occurs between an input and an output of the ninety-degree phase shifter 103. The delayed digital signal is output to the phase angle calculator 104.

The phase angle calculator 104 divides a value of the delayed digital signal input from the delay compensator 102 by a value of the phase-advanced digital signal input from the ninety-degree phase shifter 103. Further, the phase angle calculator 104 obtains an arctangent of the obtained quotient so as to send the digital signal representing the obtained arctangent to the differentiator 105.

The differentiator 105 obtains a difference between two digital signals which are input continuously (in other words, a difference between values of the two signal segments which are provided continuously), and outputs a digital signal representing the obtained difference to the D/A converter 106. The digital signal from the differentiator 105 represents a value of the signal F as a resultant signal of the FM signal X being demodulated.

The D/A converter 106 generates the signal F by converting the digital signal input from the differentiator 105 into an analog value.

In the FM demodulator shown in FIG. 5, the phase angle calculator 104 selects a value as a value of the arctangent (i.e., as a principal value) from a range of predetermined continuous $2\pi$ radians within an infinite number of sustainable values.

In the case where the angle-modulated signal is deeply modulated and the phase of the angle-modulated signal shifts greater than $2\pi$ radians, the phase angle calculator 104 tends to select an inappropriate value, such as a value which is $2\pi$ radians greater than a value of a true phase angle, or a value which is $2\pi$ radians less than a value of a true phase angle. The FM demodulator illustrated in FIG. 5 thus can not demodulate in an appropriate manner an angle-modulated signal having the phase shifting of greater than $2\pi$ radians.

SUMMARY OF THE INVENTION

The present invention has been made in consideration of the above, and an object thereof is to provide an apparatus and method for accurately demodulating an angle-modulated signal, even in a case where a phase of the angle-modulated signal shifts greater than $2\pi$ radians.

In order to achieve the above-described object, according to the first aspect of the present invention, there is provided an angle demodulator comprising:

a phase shifter (81) which inputs a digital angle-modulated signal (SI) thereto and generates a first ninety-degree phase shifted signal (SQ) representing a signal whose phase is substantially ninety degrees out of phase with respect to a signal represented by the input digital angle-modulated signal;

a digital oscillator (84, 85) which inputs a control signal ($\omega(n)$) designating an oscillation frequency thereto and generates a digital internal oscillation signal (II) representing a signal having an oscillation frequency designated by the control signal and a second ninety-degree phase shifted signal (IQ) which represents a signal whose phase is substantially ninety degrees out of phase with respect to the signal represented by the digital internal oscillation signal;

an arithmetic unit (82) which inputs the digital angle-modulated signal (SI), the first ninety-degree phase sifted signal (SQ), the digital internal oscillation signal (II) and the second ninety-degree phase shifted signal (IQ), and computes a difference between a product of the digital angle-modulated signal (SI) and the second ninety-degree phase shifted signal (IQ) and a product of the digital internal oscillation signal (II) and the first ninety-degree phase shifted signal (SQ) to generate a difference signal ($\epsilon(n)$) which represents the difference; and a frequency control unit (83) which supplies to the digital oscillator (84, 85) the control signal ($\omega(n)$) designating an oscillation frequency by which the difference signal from the arithmetic unit (82) indicates substantial zero, based on the difference signal ($\epsilon(n)$), and outputs the control signal as a digital demodulated signal ($\omega(n)$).

According to this angle demodulator, an oscillation frequency of the digital internal oscillation signal approaches one value determined in accordance with the value of the digital angle modulated signal, independent of the degrees of the phase shifting of the digital angle modulated signal. Even if the phase of the digital angle modulated signal shifts greater than $2\pi$ radians, the digital angle modulated signal is appropriately demodulated.

The phase shifter (81) may be, for example, a Hilbert transformer.

The frequency control unit (83) outputs the control signal designating as an oscillation frequency a value $\omega(n)$ expressed by equation 2 where both $K_p$ and $K_i$ represent predetermined constants, $\Sigma\epsilon$ represents a sum of the values of the supplied difference signals, and $\epsilon(n)$ represents the value of n-th supplied difference signal. In this case, for example, the digital oscillator (84, 85) inputs the control signal and generates the digital internal oscillation signal whose phase is substantially equal to a value $\theta(n)$ expressed by equation 3 when $f_s$ represents a sampling frequency of the digital angle modulated signal.

$$\omega(n)=\omega(n-1)+K_p\cdot\epsilon(n)+K_i(1/f_s)\cdot\Sigma\epsilon \quad (2)$$

$$\theta(n)=\theta(n-1)+(1/f_s)\cdot\omega(n-1) \quad (3)$$

The digital oscillators may comprises:

a digital integrator (84) which inputs the digital demodulated signal ($\omega$) thereto and generates a digital integration signal ($\theta$) which represents a result of the substantial integration of the digital demodulation signal; and a converter (85) which generates the second ninety-degree phase shifted signal and the digital internal oscillation signal having a phase represented by the digital integration signal.

The angle demodulator may comprises:

an A/D converter (6, 7) for inputting an analog angle-modulated signal and converting the analog angle-modulated signal into the digital angle-modulated signal to be output; and a D/A converter (9) for inputting the digital demodulated signal from the frequency control unit and for converting the digital demodulation signal into an analog signal to be outputted.

As having these features, the angle-demodulator can demodulate an analog angle-modulated signal and give analog reproduction.

According to the second aspect of the present invention, there is provided an angle demodulator comprising:

a phase shifter (81) for inputting an angle modulated signal (SI) and for generating a first ninety-degree phase shifted signal (SQ) which is substantially ninety degrees out of phase with respect to the angle modulated signal (SI);

an internal oscillator (84, 85) for inputting a control signal ($\omega$) designating an oscillation frequency and for generating an internal oscillation signal (II) having the oscillation frequency designated by the control signal and a second ninety-degree phase shifted signal (IQ) which is substantially ninety degrees out of phase with respect to the internal oscillation signal;

an arithmetic unit (82) for generating a difference signal ($\epsilon$) representing a difference between a product of the angle modulated signal and the second ninety-degree phase shifted signal and a product of the internal oscillation signal and the first ninety-degree phase shifted signal; and a frequency control unit (83) for supplying to the internal oscillator the control signal ($\omega$) by which the difference signal ($\epsilon$) indicates zero and for outputting the control signal as a demodulation signal.

The oscillation frequency of the internal oscillation signal approaches one value determined by the value of the angle modulated signal, independent of the degree of the phase shifting of the angle modulated signal. Even if the phase of the angle modulated signal shifts greater than $2\pi$ radians, the angle modulated signal is appropriately demodulated.

The phase shifter (81) may be a Hilbert transformer or the like, for performing a Hilbert transform on the angle-modulated signal and for generating the first ninety-degree phase shifted signal.

The frequency control unit (83) inputs the difference signal ($\epsilon$) and outputs the control signal by which the oscillation frequency of the internal oscillator is varied so as to be substantially proportional to a sum of a value proportional to the difference signal and an integration value of the difference signal.

The internal oscillator may comprise:

an integrator (84) which integrates the demodulated signal and generates an integration signal; and a converter (85) which generates the internal oscillation signal (II) having a value designated by the integration signal as a phase, and the second ninety-degree phase shifted signal (IQ) which is substantially ninety degrees out of phase with respect to the internal oscillation signal.

Each of the signals may be an analog signal or a digital signal whose value represents a substantial instantaneous value of each of the signals.

According to the third aspect of the present invention, there is provided an angle-demodulator comprising:

an oscillator (84, 85) which inputs a control signal ($\omega$) designating an oscillation frequency and generates an internal oscillation signal (II) having the oscillation frequency designated by the control signal;

an arithmetic unit (82) inputs an angle-modulated signal (SI) and the internal oscillation signal (II) and generates a phase difference signal ($\epsilon$) representing a phase difference between the angle-modulated signal (SI) and the internal oscillation signal (II); and a frequency control unit (83) which generates the control signal controlling an oscillation frequency of the internal oscillation signal (II) so as the phase difference signal to approach zero on the basis of the phase difference signal ($\epsilon$), supplies the control signal to the internal oscillator and outputs the control signal as a demodulated signal.

According to the angle-demodulator of the present invention, the oscillation frequency of the digital internal oscillation signal approaches one value determined by the value of the angle modulated signal, independent of the degree of the phase shifting of the digital angle-modulated signal. Therefore, even if the phase of the digital angle modulated signal shifts greater than $2\pi$ radians, the digital angle modulated signal is appropriately demodulated.

Each of the signals may be an analog signal or a digital signal whose value represents a substantial instantaneous value of each of the signal.

According to the fourth aspect of the present invention, there is provided a method for demodulating an angle modulated signal comprising:

an oscillating (84, 85) step of inputting a control signal designating an oscillation frequency thereto and generating an oscillation signal having the oscillation frequency designated by the control signal;

an arithmetic step (82) of inputting an angle-modulated signal (SI) and the oscillation signal (II) thereto, and generating a phase difference signal ($\epsilon$) representing a phase difference between the angle modulated signal and the oscillation signal; and a frequency control step of generating the control signal which controls the oscillation frequency of the internal oscillation signal so as the phase difference signal to approach zero, on the basis of the phase difference signal, and outputting the control signal as a demodulated signal.

The oscillating step may comprise the steps of inputting the control signal (ω) designating the oscillation frequency, and generating the oscillation signal (II) having the oscillation frequency designated by the control signal and a second ninety-degree phase shifted signal (IQ) which is substantially ninety degrees out of phase with respect to the oscillation signal, the arithmetic step may comprise the steps of inputting an angle-modulated signal (SI) and generating a first ninety-degree phase shifted signal (SQ) which is substantially ninety degrees out of phase with respect to the angle modulated signal (SI), and generating a difference signal (ε) representing a difference between a product of the angle-modulated signal and the second ninety-degree phase shifted signal and a product of the oscillation signal and the first ninety-degree phase shifted signal, and the frequency control step may comprise the steps of generating the control signal (ω) so as to control the difference signal (ε) indicating zero, and outputting the control signal as a demodulated signal.

The phase shifting step converts the angle-modulated signal by means of a Hilbert transform to generate the first ninety-degree phase shifted signal (SQ).

The frequency control step inputs the difference signal and controls the oscillation frequency so as to be substantially proportional to a sum of a value proportional to the difference signal and an integration value of the difference signal.

The oscillation step further comprises, for example, the steps of integrating the control signal so as to generate an integration signal; and generating the oscillation signal (II) having a phase designated by the integration signal and the second ninety-degree phase shifted signal (IQ) which is substantially ninety degrees out of phase with respect to the oscillation signal.

The frequency control step outputs the control signal designating a value ω (n) obtained by equation 4 as an oscillation frequency, when each of $K_p$ and $K_i$ represents a predetermined constant, Σε represents a total sum of values of the supplied difference signals, a value ε(n) represents the value of the n-th supplied difference signal, and the oscillation step may input the control signal and generate the oscillation signal whose phase is substantially equal to a value θ (n) expressed by equation 5, when $f_s$ represents a sampling frequency of the angle modulated signal.

$$\omega(n) = \omega(n-1) + K_p \cdot \epsilon(n) + K_i \cdot (1/f_s) \cdot \Sigma \epsilon \quad (4)$$

$$\theta(n) = \theta(n-1) + (1/f_s) \cdot \omega(n-1) \quad (5)$$

Each of the signals may be an analog signal or a digital signal whose value indicates a substantial instantaneous value of the signal.

DETAILED DESCRIPTION OF THE PREFERRED EMBODIMENT

As a digital angle demodulator according to one embodiment of the present invention, an FM receiver will now be described by way of example.

Figure 1:
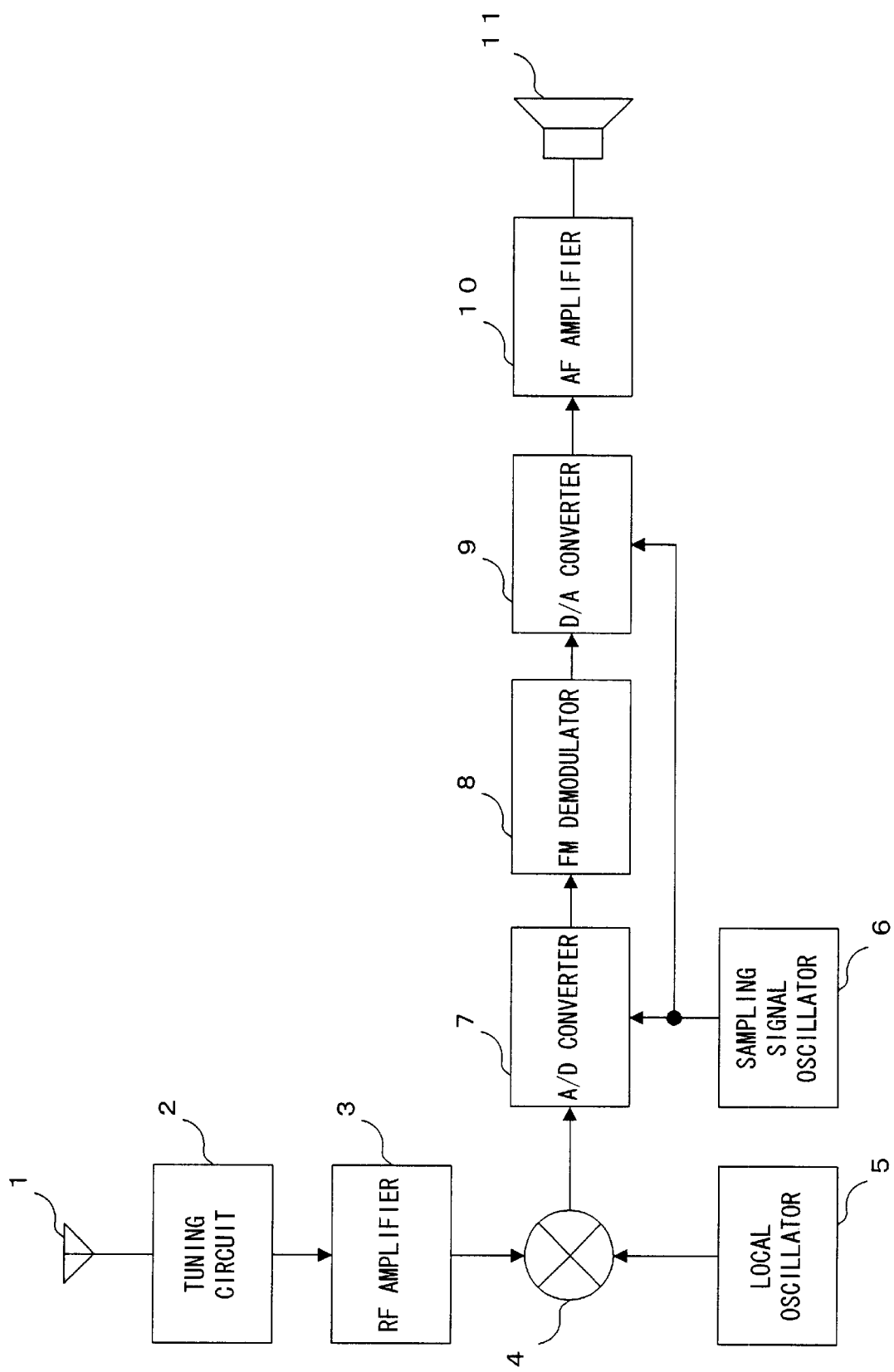
FIG. 1 is a block diagram showing the basic structure of an FM receiver according to one embodiment of the present invention.

FIG. 1 is a diagram exemplifying the structure of the FM receiver according to one embodiment of the present invention.

As seen from FIG. 1, the FM receiver comprises an antenna 1, a tuning circuit 2, an RF (Radio Frequency) amplifier 3, a mixer 4, a local oscillator 5, a sampling signal oscillator 6, an A/D (Analog to Digital) converter 7, an FM (Frequency Modulation) demodulator 8, a D/A (Digital to Analog) converter 9, an AF (Audio Frequency) amplifier 10 and a speaker 11.

The tuning circuit 2 tunes an FM signal supplied from the antenna 1 at a certain frequency which a user has selected for demodulation. The tuning circuit 2 then transmits the tuned FM signal to the RF amplifier 3.

The RF amplifier 3 amplifies the input FM signal which is then sent to the mixer 4.

The mixer 4 mixes the amplified FM signal and a local oscillation signal output from the local oscillator 5, generates an IF (Intermediate Frequency) signal and transmits the IF signal to the A/D converter 7.

The IF signal is an FM signal whose carrier frequency is converted into a predetermined intermediate frequency.

The local oscillator 5 including a crystal oscillator or the like outputs the above local oscillation signal.

The sampling signal oscillator 6 generates a sampling signal which represents a timing at which the FM signal is sampled by the A/D converter 7, and outputs the sampling signal to the A/D converter 7. The sampling signal is one whose frequency is more than twice as high as the carrier frequency of the IF signal which is output by the mixer 4.

The A/D converter 7 samples the IF signal supplied from the mixer 4, in synchronism with the sampling signal supplied from the sampling signal oscillator 6. The A/D converter 7 quantizes (digitizes) the sampled IF signal in order to convert it into a digital signal and outputs the converted digital signal to the FM demodulator 8.

The FM demodulator 8 demodulates the digital IF signal which is supplied from the A/D converter 7, and outputs to the D/A converter 9 a demodulated digital AF signal.

Figure 2:
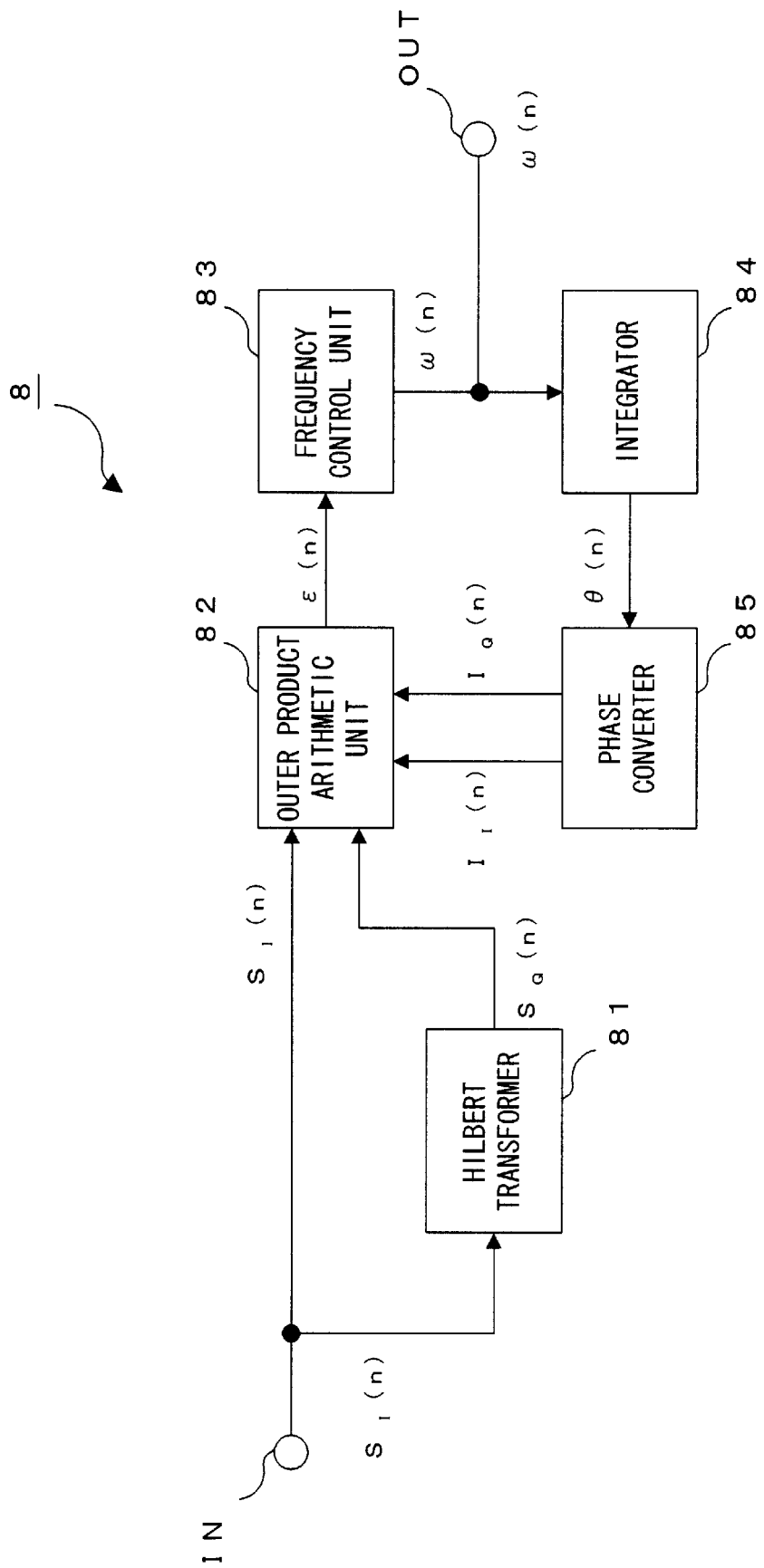
FIG. 2 is a block diagram showing the theoretical structure of an FM demodulator.

As illustrated in FIG. 2, the FM demodulator 8 in a theoretical sense comprises a Hilbert transformer 81, an outer product arithmetic unit 82, a frequency control unit 83, an integrator 84 and a phase converter 85.

The Hilbert transformer 81 performs a Hilbert transform on the digital signal supplied from the A/D converter 7 to generate a digital signal representing a signal which delays by ninety degrees with respect to the FM signal represented by the supplied digital signal. The Hilbert transformer 81 then outputs the generated digital signal to the outer product arithmetic unit 82.

The outer product arithmetic unit 82 receives the digital signals output from the A/D converter 7 and the Hilbert transformer 81, and receives a digital cosine signal and a digital sine signal output from the phase converter 85.

The outer product arithmetic unit 82 computes (1) a two-dimensional vector including a value of a digital signal input from the A/D converter 7 and a value of a digital signal input from the Hilbert transformer 81 as components, (2) a two-dimensional vector including a value of the digital cosine signal and a value of the digital sine signal input from the phase converter 85 as components, and (3) an outer product of the above two dimensional vectors (the outer product in the two-dimensional space). The outer product arithmetic unit 82 supplies the obtained outer product to the frequency control unit 83.

The frequency control unit 83 generates frequency designating data which designates the oscillation frequency of the phase converter 85 in accordance with a procedure (which will be described later), on the basis of the outer product supplied from the outer product arithmetic unit 82. The frequency control unit 83 then supplies the frequency designating data to the integrator 84 and D/A converter 9.

The integrator 84 integrates the value of the frequency designating data supplied from the frequency control unit 83 to generate phase data which represents an instantaneous value of a phase of an oscillation signal whose frequency is substantially equal to one designated by the frequency designating data. The integrator 84 supplies the generated phase data to the phase converter 85.

The phase converter 85 receives the phase data from the integrator 84 and generates a digital signal (the digital cosine signal) representing the instantaneous value of the oscillation signal and a digital signal (the digital sine signal) representing an instantaneous value of a signal whose phase is delayed than that of the oscillation signal by ninety degrees, in accordance with a procedure which will be described later. The phase converter 85 supplies the generated digital sine and digital cosine signals to the outer product arithmetic unit 82.

The D/A converter 9 shown in FIG. 1 converts to an analog voltage a digital signal which is supplied from the frequency control unit 83 of the FM demodulator 8 and supplies the analog voltage to the AF amplifier 10 as an AF signal.

The AF amplifier 10 amplifies the supplied AF signal and reproduces the
AF signal as sound by driving the speaker 11.

Operations

Operations of the FM receiver according to this embodiment of the present invention will now be explained with reference to FIGS. 1 and 2.

The tuning circuit 2 tunes the FM modulated signal with the frequency designated by the user. The tuned FM modulated signal is supplied to the RF amplifier 3, and the amplified signal is delivered to the mixer 4.

The mixer 4 generates an IF signal by mixing the amplified FM modulated signal and the local oscillation signal supplied from the local oscillator 5, and supplies the IF signal to the A/D converter 7.

For the sake of easy understanding, assume that the AF signal v (t) as a modulation signal (an original signal) of the received FM modulated signal is expressed by equation 6. In equation 6, t, $\omega_p$ and $\psi$ represent time, an angular frequency of a modulation signal and an initial phase (that is, when t=0) of the modulation signal, respectively.

$$v(t)=\cos\{(\omega_p \cdot t)+\psi\} \tag{6}$$

The value of the to-be-demodulated IF signal S (t) is represented by equation 7. In equation 7, $\phi(t)$, $\omega_c$, and $\omega_d$ represents a phase at a time t of the IF signal, an angular frequency of a carrier of the IF signal (that is, a multiple of an intermediate frequency and 2·π) and a maximum frequency deviation, respectively.

$$S(t)=S\cdot\cos\{\phi(t)\}=S\cdot\cos\{(\omega_c \cdot t)+\omega_d \cdot \int v(t)dt\}=S\cdot\cos[(\omega_c \cdot t)+\delta\cdot\sin\{(\omega_p \cdot t)+\psi\}] \text{ where } \delta=\omega_d/\omega_p \tag{7}$$

The A/D converter 7 inputs a sampling signal from the sampling signal oscillator 6 and samples the IF signal which is input from the mixer 4 in response to the sampling signal.

The A/D converter 7 quantizes or digitizes sampling values of the IF signal to generate a digital signal which is output to the Hilbert transformer 81 and outer product arithmetic unit 82 of the FM demodulator 8.

Where n represents the sequential order of the digital signals (segments) each representing a voltage value (the sampled values) of the IF signal, $f_s$ represents the sampling frequency, the n-th sampled voltage values $S_I$ (n) can be expressed by the value S (t) at a time ($n/f_s$), as shown in the right side of equation 8.

$$S_I(n)=S\cdot\cos\{(n/f_s)\}=S\cdot\cos[\{\omega_c \cdot (n/f_s)\}+\{\delta\cdot\sin(\omega_p \cdot (n/f_s))\}+\psi] \tag{8}$$

In order to demodulate a modulated signal with high accuracy, according to the Nyquist's theorem, the value of the sampling frequency $f_s$ needs to be greater than the Nyquist frequency of the modulation signal.

That is, $f_s$ and $\omega_p$ have to satisfy Inequality 9.

$$f_s \geq 2\cdot\{\omega_p/(2\cdot\pi)\}=\omega_p/\pi \tag{9}$$

Digital signals representing the respective voltage values $S_I$ (n) are delivered to the Hilbert transformer 81 in a sequential order, successively beginning from a digital signal (segment) representing voltage value $S_I$ (1). The Hilbert transformer 81 performs the Hilbert transform on each voltage value $S_I(n)$ and outputs the respective voltage representing the results of the transform to the outer product arithmetic unit 82.

Let's assume that the Hilbert-transformed voltage value $S_I(n)$ is represented by a value $S_Q(n)$. The value $S_Q(n)$ can be represented by equation 10.

$$S_Q(n)=S\cdot\sin[\{\omega_c \cdot (n/fs)\}+\{\delta\cdot\sin(\omega_p \cdot (n/fs))\}+\psi] \tag{10}$$

For a cosine wave having a frequency which is nearly equal to the frequency designated by the frequency designated data (most recently updated data) which is supplied from the frequency control unit 83, the integrator 84 calculates an instantaneous value of a phase of the cosine wave substantially at a timing when the above-described IF signal is sampled.

In more detail, the integrator 84 calculates the updated right side of equation 11 with the instantaneous value $\theta(n-1)$ of the calculated phases of the cosine wave, an updated angular frequency $\omega(n-1)$ delivered from the frequency control unit 83 and a sampling frequency $f_s$ of the A/D converter 7 to obtain the instantaneous value $\theta(n)$ of the most recently updated phase.

"n" indicates is the sequential order of the calculated instantaneous values of the phase. When a first instantaneous value $\theta(1)$ of the phase is calculated, make a product of the value ($1/f_s$) and the value $\omega(0)$ as the value $\theta(1)$.

$$\theta(n)=\theta(n-1)+(1/f_s)\cdot\omega(n-1) \tag{11}$$

The integrator 84 supplies a digital signal representing the obtained value $\theta(n)$ to the phase converter 85.

The phase converter 85 calculates a cosine and sine values of the phase $\theta(n)$ represented by the supplied digital signal, generates a cosine and sine signals representing the resultant calculations to supply these signals to the outer product arithmetic unit 82.

That is, the phase converter 85 generates the digital cosine signal representing the value $I_I$ (n) obtained by calculating the right side of equation 12 and the digital sine signal representing the value $I_Q$ (n) obtained by calculating the right side of equation 13, to supply these cosine and sine signals to the outer product arithmetic unit 82. In equations 12 and 13, "I" is a constant representing amplitude of the cosine wave represented by the digital cosine signal and of the sine wave represented by the digital sine signal.

$$I_I(n) = I \cdot \cos\{\theta(n)\} \tag{12}$$

$$I_I(n) = I \cdot \sin\{\theta(n)\} \tag{13}$$

The outer product arithmetic unit 82 calculates the outer products based on the digital signals supplied from the A/D converter 7, the Hilbert transformer 81 and the phase converter 85.

Particularly, the outer product arithmetic unit 82 computes the value $\epsilon(n)$ of the left side of equation 14 by calculating the right side of equation 14 with the above-mentioned $S_I(n)$, $S_Q(n)$, $I_I$ (n) and $I_Q(n)$ to supply an obtained value $\epsilon(n)$ to the frequency control unit 83.

$$\epsilon(n) = \{S_I(n) \cdot I_Q(n)\} - \{S_Q(n) \cdot I_I(n)\} \tag{14}$$

The value $\epsilon(n)$ represents an outer product (scalar), in the two dimensional space, of the two vectors $[S_I(n), S_Q(n)]$ and $[I_I(n), I_Q(n)]$. $[\alpha, \beta]$ represents a vector in a plane including an x (horizontal) and y (vertical) axes perpendicular with each other on a plane wherein the $\alpha$ represents a component of x-axis direction and the P represents a component of y-axis direction.

The frequency control unit 83 calculates the right side of equation 15 by using the outer product $\epsilon(n)$ supplied from the outer product arithmetic unit 82 and determines a new angular frequency $\omega(n)$ of the sine wave expressed by the phase data output from the integrator 84 and supplies a digital signal representing the value $\omega$ (n) to the integrator 84 and to the D/A converter 9.

In equation 15, $K_p$ and $K_i$ are the predetermined constants, $\Sigma\epsilon$ represents a total sum of the previously supplied outer products $\epsilon(n)$, and fs represents a sampling frequency of the A/D converter 7.

$$\omega(n) = \omega(n-1) + \Delta\omega(n) \text{ where } \Delta\omega(n) = K_p \cdot \epsilon(n) + K_i \cdot (1/f_s) \cdot \Sigma\epsilon \tag{15}$$

A value $\Delta\omega(n)$ expresses a sum of a value which is proportional to $\epsilon(n)$ and an integrated value $\epsilon(n)$. That is, the value $\omega$ (n) is controlled by a proportional integral control (PI control) based on the value $\epsilon(n)$.

As explained above, the value $\omega(n)$ approaches the angular frequency of the IF signal at a certain time point at which the voltage value $S_I(n)$ of the IF signal is sampled. The angular frequency of the IF signal is substantially equal to the value of the time differential $d\{\phi(t)\}/dt$ of the phase of the IF signal, that is, the value indicated on the right side of equation 16.

$$\omega(n) = d\{\phi(t)\}/dt = \omega_c + [\delta \cdot \omega_p \cdot \cos\{\omega_p \cdot (n/f_s)\}] = \omega_c + [\omega_d \cdot \cos\{\omega_p \cdot (n/f_s)\}] \tag{16}$$

The term, $\cos\{\omega \cdot (n/f_s)\}$ on the right side of the equation 16 is substantially equal to the values of the AF signal v (t) shown in equation 6 (a modulation-signal of the received FM modulated signal) sampled by the sampling frequency $f_s$. The value $\omega(n)$ is substantially equal to a value in which the angular frequency $\omega_c$ of the carrier wave of the IF signal is added to the value $[\omega_d \cdot \cos\{\omega_p \cdot (n/f_s)\}]$ of the AF signal v(t) multiplied by the maximum frequency deviation $\omega_d$.

Hence, an alternating component of the value $\omega(n)$ is substantially proportional to a value which is obtained by sampling a signal proportional to the AF signal by the sampling frequency $f_s$.

As the result that the value $\omega(n)$ approaches the value of the angular frequency of the IF signal at the time $(n/f_s)$, the value $\theta(n)$ which is the integration value of the $\omega(n)$ approaches the value of the phase of the IF signal at the time $(n/f_s)$.

The value $\theta(n)$ is not limited within a range of $2\pi$.

The integrator 84 to which the value $\omega(n)$ of the updated angular frequency is delivered obtains the instantaneous value $\theta(n+1)$ of the phase of a cosine wave having an angular frequency which is nearly equal to the updated angular frequency $\omega(n)$ delivered from the frequency control unit 83, approximately at the same time point as the IF signal being sampled.

The integrator 84 provides a digital signal representing the value of the obtained $\theta(n+1)$ to the phase converter 85. The phase converter 85 generates the digital cosine and sine signals representing the value $I_I$ (n+1) proportional to the cosine of a value $\theta(n+1)$ and the value $I_Q$ (n+1) proportional to the sine of a value $\theta(n+1)$, respectively. The phase converter 85 then supplies the generated digital cosine and sine signals to the outer product arithmetic unit 82.

The outer product arithmetic unit 82 receives the digital cosine and sine signals representing values $I_I$ (n+1) and $I_Q(n+1)$ from the phase converter 85, the voltage value $S_I(n+1)$ which is sampled following the value $S_I(n)$ from the A/D converter 7, and a digital value $S_Q(n+1)$ representing the result of the Hilbert transform of value $S_I(n+1)$ from the Hilbert transformer 81.

The outer product arithmetic unit 82 obtains an outer product $\epsilon(n+1)$ of two vectors $[S_I(n+1), S_Q(n+1)]$ and $[I_I(n+1), I_Q(n+1)]$, with the above described procedure and transmits the obtained product value $\epsilon(n+1)$ to the frequency control unit 83.

The FM demodulator 8 successively obtains the digital signals representing the respective voltage values sampled by the A/D converter 7. The FM demodulator 8 then successively supplies the updated angular frequency $\omega(n)$ which the frequency control unit 83 has continuously determined, from the frequency control unit 83 to the D/A converter 9.

The D/A converter 9 converts the angular frequency $\omega(n)$ supplied from the frequency control unit 83 of the FM demodulator 8 into an analog voltage, and outputs the converted voltage to the AF amplifier 10 per sampling frequency $1/f_s$.

The AF amplifier 10 drives the speaker 11 after amplifying the analog AF signal supplied from the D/A converter 9, the speaker 11 reproduces an alternating component of the analog signal as a audio sound.

The alternating component of the angular frequency $\omega(n)$ is substantially equal to a value which is obtained by adding a direct component of the angular frequency $\omega(n)$ to a value obtained by sampling a signal proportional to the modulation signal of the received FM modulated signal at the sampling frequency $f_s$. The sampling frequency $f_s$ is greater than the Nyquist rate of the frequency of the modulated signal of the FM modulated wave which the FM receiver has received.

Consequently, the speaker 11 can reproduce an audio sound or voice which is substantially identical to the modulation signal v(t) of the received FM signal.

The structure of the FM receiver of this embodiment is not limited to the above-described structure, instead, other modifications and changes may be made.

For example, the sampling signal oscillator 6 or the FM demodulator 8 may comprise a discrete part, otherwise, a part or the entire parts thereof may be a DSP (Digital Signal Processor) or a CPU (Central Processing Unit). In the case where the DSP (Digital Signal Processor) or the CPU (Central Processing Unit) is used, a part or the entire parts of the above functions can be realized by employing known software technology.

The Hilbert transformer 81 may generates a digital signal representing a signal whose phase advances that of the FM modulation signal by an angle of ninety degrees.

PM (Phase Modulation) Demodulator

Figure 3:
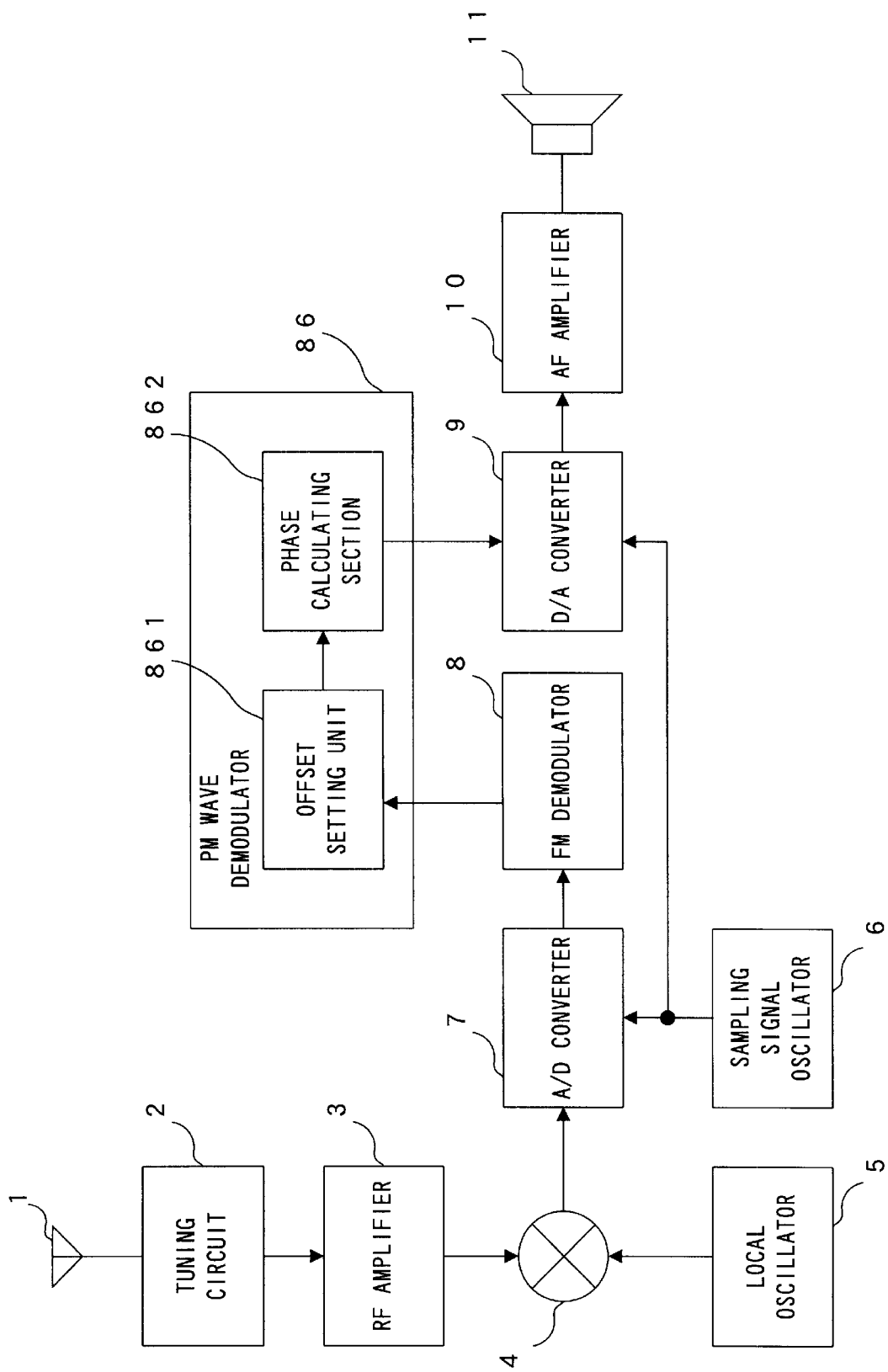
FIG. 3 is a block diagram showing a modification of the FM receiver illustrated in FIG. 1.

As seen from FIG. 3, the receiver of this embodiment can demodulate a PM (Phase Modulation) signal by connecting a PM demodulation section 86 between the frequency control unit 83 and the D/A converter 9.

The PM demodulation section 86 comprises, for example, an offset setting unit 861 and a phase calculating section 862, as illustrated in FIG. 3.

The offset setting unit 861 obtains from the frequency control unit 83 digital signals representing angle frequency $\omega(n)$ and stores a predetermined number of most recently received digital signals. Every time an updated digital signal is provided from the frequency control unit 83, the offset setting unit 861 calculate the mean value of the stored $\omega(n)$s, subtracts the calculated mean value from the most recently received angle frequency $\omega(n)$, and generates a digital signal representing a difference $\omega_{AC}(n)$ which is then supplied to the phase calculating section 862. The value $\omega_{AC}(n)$ is substantially equal to a value obtained by subtracting the direct component of the angle frequency from the most recent angle frequency $\omega(n)$.

More specifically, the offset setting unit 861 (i) stores "k" piece of the most recently updated or supplied frequency designating data $\{\omega(n), \omega(n-1), \omega(n-2)... \omega(n-k+1)\}$ which is supplied from the frequency control unit 83, (ii) calculates the mean value, $\{\omega(n), \omega(n-1), \omega(n-2)+ ... + \omega(n-k+1)\}/k$, (iii) subtracts the calculated mean value from the most recently updated or supplied frequency designating data $\omega(n)$, and (iv) generates a digital signal representing the difference $\omega_{AC}(n)=\omega(n)-\{\omega(n), \omega(n-1), \omega(n-2)+ ... +\omega(n-k+1)\}/k$, which is then supplied to the phase calculating section 862.

The phase calculating section 862 performs operations substantially identical to those of the integrator 84.

When a new digital signal representing a value $\omega_{AC}(n)$ is delivered, the phase calculating section 862 calculates a phase $\theta_{PM}(n)$ which is expressed by equation 17. This phase $\theta_{PM}(n)$ is substantially equal to the value which is obtained by integrating the angle phase $\omega_{AC}(n)$.

$$\theta_{PM}(n)=\theta_{PM}(n-1)+(1/f_s)\cdot\omega_{AC}(n-1) \quad (17)$$

For the sake of easy understanding, assume that a modulation signal of the received phase-modulated is represented as a signal v(t) is expressed by equation 6. In this case, the IF signal $S_{PM}(t)$ output from the mixer 4 is expressed by equation 18. In equation 18, $P_d$ denotes a modulation index.

$$S_{PM}(t)=S\cdot\cos\{\phi_{PM}(t)\}=S\cdot\cos\{(\omega_c\cdot t)+P_d\cdot v(t)\}=S\cdot\cos[(\omega_c\cdot t)+P_d\cdot\cos\{(\omega_p\cdot t)+\psi\}] \quad (18)$$

When the IF signal supplied from the mixer 4 to the A/D converter 7 is expressed by equation 18, the digital signal $\omega(n)$ output from the frequency control unit 83 is expressed by equation 19.

$$\omega(n)=d\{\phi_{PM}(t)\}/dt=\omega_c-[\omega_p\cdot\sin\{\omega_p\cdot(n/f_s)\}] \text{ where, } t=n/f_s \quad (19)$$

The angle frequency $\omega_{AC}(n)$ represented by the digital signal from the offset setting unit 861 of the PM demodulating section 86 is obtained by equation 20.

$$\omega_{AC}(n)=-[\omega_p\cdot P_d\cdot\sin\{\omega_p\cdot(n/f_s)\}] \quad (20)$$

The phase $\theta_{PM}(n)$ calculated by the phase calculating section 862 is expressed by equation 21.

$$\theta_{PM}(n)\cong\int\omega_{AC}(t)dt=P_d\cdot\cos\{\omega_p\cdot(n/f_s)\}+\gamma \quad (21)$$

where, $t=n/f_s$, and $\gamma$ denotes an integration constant.

As seen from equation 21, the value $\theta_{PM}(n)$ is equal to a value obtained by adding the constant $\gamma$ to a value which is obtained by sampling, at the sampling frequency $f_s$, a signal having an amplitude proportional to the modulation signal v(t).

The alternating component of the value (phase) $\theta_{PM}(n)$ is proportional to a value which is obtained by sampling a signal proportional to the modulation signal v(t) at the sampling frequency $f_s$. Consequently, the speaker 11 reproduces a voice substantially identical to the sound which is expressed by the modulation signal v(t).

The value $\theta_{PM}(n)$ is not limited in a range of $2\pi$. Even if the phase of the IF signal shifts greater than $2\pi$ radians, the value (phase) $\theta_{PM}(n)$ can approach the phase of the IF signal at a time point $(n/f_s)$.

The Hilbert transformer 81, the outer product arithmetic unit 82, the frequency control unit 83, the integration section 84 and the phase converter 85 all included in the FM demodulator 8 may be in the form of an analog circuit respectively.

The Hilbert transformer 81 and the phase converter 85 of the FM demodulator 8 may be formed of an entire-frequency pass filter which substantially causes the phase of the supplied alternating signal to shift by the angle of ninety degrees. The outer product arithmetic unit 82 can be formed of an analog multiplication circuit and an analog subtraction circuit, whereas the integration section 84 can be a voltage controlled oscillator (VCO) oscillates in accordance with the signal supplied from the frequency control unit 83.

Figure 4:
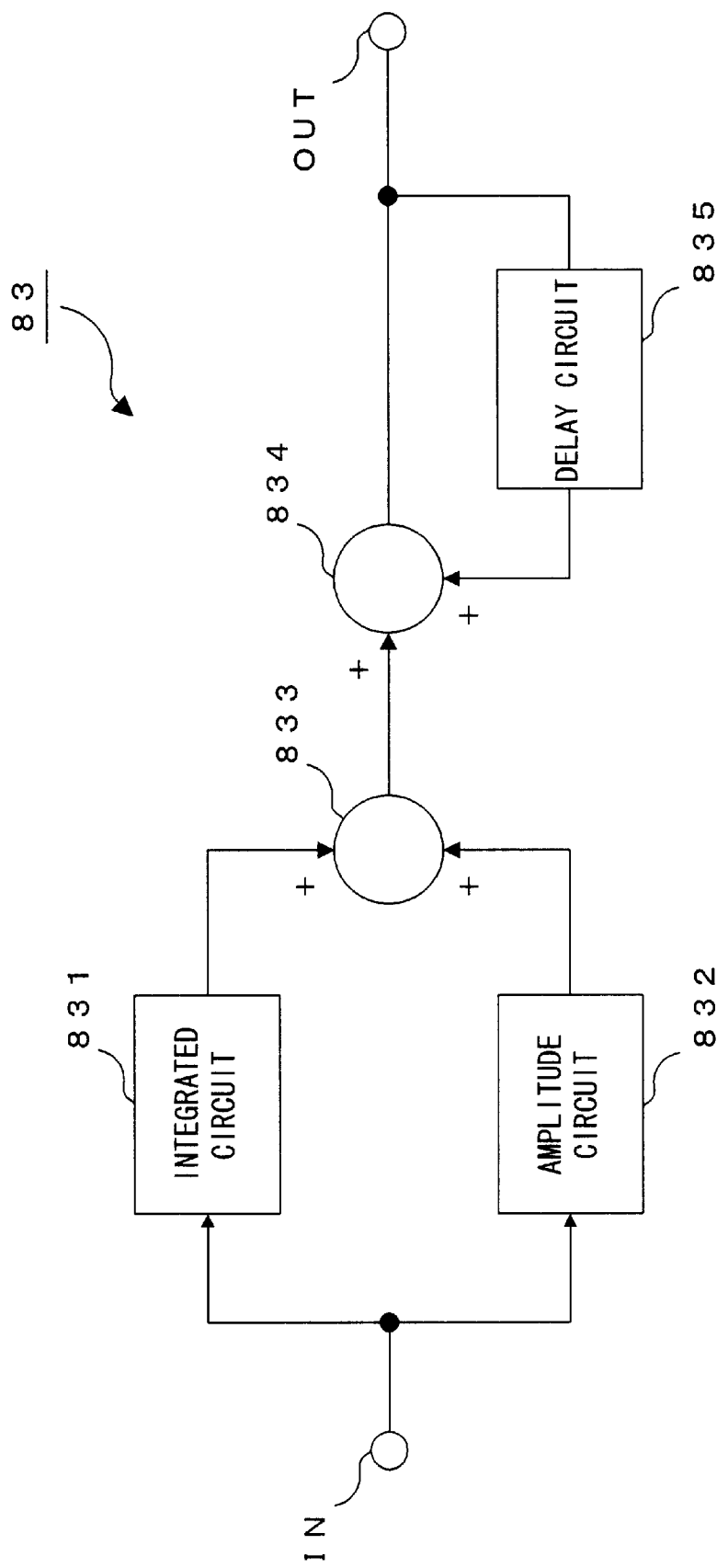
FIG. 4 is a block diagram showing a modification of a frequency control unit shown in FIG. 2.
Figure 5:
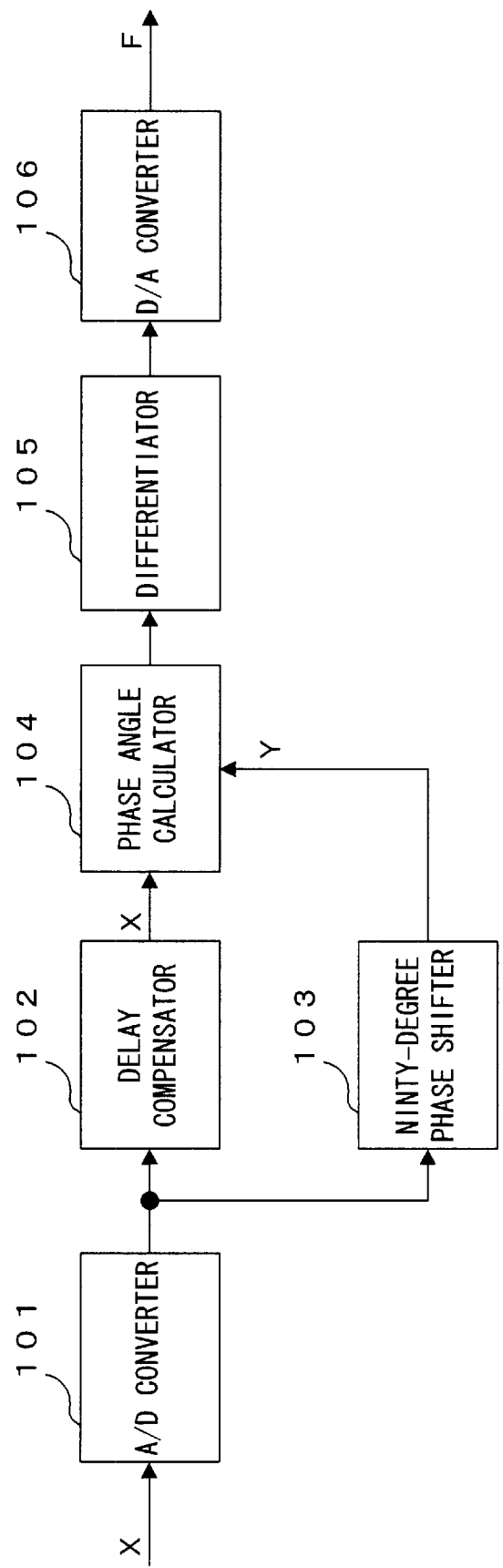
FIG. 5 is a block diagram showing the structure of a conventional FM demodulator.

As illustrated in FIG. 4, the frequency control unit 83 may include an analog integration circuit 831, an analog amplifier circuit 832, an analog adders 833, 834 and a delay circuit 835.

It is not necessary to input the to-be-demodulated angle-modulated signal from the antenna 1 to the FM receiver. The to-be-demodulated angle-modulated signal may be input from a cable line instead, for example.

The demodulation signal can be not only a voice signal, but an image signal. In the case where the image signal is obtained by demodulation, the angle-demodulator of the present invention may comprise, for example, a CRT (cathode-ray tube) and a driver circuit of the CRT, in place of the speaker 11.

The demodulated signal may further be modulated in accordance with a desired method. In this case, the demodulator for further demodulating the demodulation signal may be included in place of the speaker 11.

The angle demodulator of the present invention can be realized with an ordinary computer system. An angle demodulator executing the above operations can be realized by installing a program for executing the above operations to a computer having the A/D/ and D/A converters, from a recording medium, such as a floppy disk, a CD-ROM or the like, storing the program. The codes constituting the program may be embedded in a carrier wave. For example, the program can be uploaded on the Bulletin Board Systems (BBS) of the communication network so that the program (program codes) can be embedded in the carrier wave of the network and transmitted via the network.

When this program runs, the above operations can be executed under the control of the OS.

In a case where a part of the operations is assigned to the OS or the OS comprises one of the structural elements of the present invention, a program excluding other parts can be stored to a storage medium. As stated above, the angle demodulator of the present invention can appropriately demodulate the angle-modulated signal even if the phase of the angle-demodulated wave shifts greater than $2\pi$ radians.

What is claimed is:

1. An angle demodulator comprising:

a phase shifter (81) which inputs a digital angle-modulated signal (SI) thereto and generates a first ninety-degree phase shifted signal (SQ) representing a signal whose phase is substantially ninety degrees out of phase with respect to a signal represented by the input digital angle-modulated signal;

a digital oscillator (84, 85) which inputs a control signal ($\omega(n)$) designating an oscillation frequency thereto and generates a digital internal oscillation signal (II) representing a signal having an oscillation frequency designated by the control signal and a second ninety-degree phase shifted signal (IQ) which represents a signal whose phase is substantially ninety degrees out of phase with respect to the signal represented by said digital internal oscillation signal;

an arithmetic unit (82) which inputs said digital angle modulated signal (SI), said first ninety-degree phase shifted signal (SQ), said digital internal oscillation signal (II) and said second ninety-degree phase shifted signal (IQ), and computes a difference between a product of said digital angle-modulated signal (SI) and said second ninety-degree phase shifted signal (IQ) and a product of said digital internal oscillation signal (II) and said first ninety-degree phase shifted signal (SQ) to generate a difference signal ($\epsilon(n)$) which represents said difference; and a frequency control unit (83) which supplies to said digital oscillator (84, 85) said control signal ($\omega(n)$) designating an oscillation frequency by which the difference signal from said arithmetic unit (82) indicates substantial zero, based on said difference signal ($\epsilon(n)$), and outputs said control signal as a digital demodulated signal ($\omega$).

2. The angle demodulator according to claim 1, wherein said phase shifter (81) is a Hilbert transformer.

3. The angle demodulator according to claim 1, wherein said frequency control unit (83) outputs said control signal designating as an oscillation frequency a value $\omega(n)$ expressed by equation 22 where both $K_p$ and $K_i$ represent predetermined constants, $\Sigma\epsilon$ represents a sum of the values of the supplied difference signals, $\epsilon(n)$ represents the value of n-th supplied difference signal, and said digital oscillator (84, 85) inputs said control signal thereto and generates said digital internal oscillation signal whose phase is substantially equal to a value $\theta(n)$ expressed by equation 23 where $f_s$, represents a sampling frequency of said digital angle modulated signal, $$\omega(n)=\omega(n-1)+K_p\cdot\epsilon(n)+K_i\cdot(1/f_s)\cdot\Sigma\epsilon \quad (22)$$

$$\theta(n)=\theta(n-1)+(1/f_s)\cdot\omega(n-1) \quad (23)$$

4. The angle demodulator according to claim 1, wherein said digital oscillator comprises:

a digital integrator (84) which inputs said digital demodulated signal ($\omega$) thereto and generates a digital integration signal ($\theta$) which represents a result of substantial integration of said digital demodulation signal; and a converter (85) which generates said second ninety-degree phase shifted signal and said digital internal oscillation signal having a phase represented by said digital integration signal as a phase.

5. The angle demodulator according to claim 1 comprising an A/D converter (6, 7) which inputs an analog angle-modulated signal and converts said analog angle modulated signal to a digital signal to be outputted.

6. The angle modulator according to claim 1 comprising: a D/A converter (6, 9) which inputs said digital demodulation signal from said frequency control unit and converts a value of said digital demodulation signal to an analog value to be outputted.

7. An angle demodulator comprising:

a phase shifter (81) which inputs an angle modulated signal (SI) thereto and generates a first ninety-degree phase shifted signal (SQ) which is substantially ninety degrees out of phase with respect to said angle modulated signal (SI);

an internal oscillator (84, 85) which inputs a control signal ($\omega$) designating an oscillation frequency and generates an internal oscillation signal (II) having the oscillation frequency designated by said control signal and a second ninety-degree phase shifted signal (IQ) which is substantially ninety degrees out of phase with respect to said internal oscillation signal;

an arithmetic unit (82) which generates a difference signal ($\epsilon$) representing a difference between a product of said angle modulated signal and said second ninety-degree phase shifted signal and a product of said internal oscillation signal and said first ninety-degree phase shifted signal; and a frequency control unit (83) which supplies to said internal oscillator said control signal ($\omega$) by which said difference signal ($\epsilon$) indicates zero and outputs said control signal as a demodulation signal.

8. The angle demodulator according to claim 7, wherein said phase shifter (81) is a Hilbert transformer.

9. The angle demodulator according to claim 7, wherein said frequency control unit (83) inputs said difference signal ($\epsilon$) thereto, and outputs said control signal by which an oscillation frequency of said internal oscillator is varied so as to be substantially proportional to a sum of a value proportional to said difference signal and an integration value of said difference signal.

10. The angle demodulator according to claim 7, wherein said internal oscillator comprises:

an integrator (84) which integrates said demodulated signal and generates an integration signal; and a converter (85) which generates said internal oscillation signal (II) having a value designated by said integration signal as a phase, and said second ninety-degree phase shifted signal (IQ) which is substantially ninety degrees out of phase with respect to said internal oscillation signal.

11. The angle demodulator according to claim 7, wherein each of said signals is a digital signal whose a value represents a substantial instantaneous value of the respective signals.

12. An angle demodulator comprising:
- an oscillator (84, 85) which inputs a control signal (ω) designating an oscillation frequency and generates an internal oscillation signal (II) having the oscillation frequency designated by said control signal;
- an arithmetic unit (82) which inputs an angle-modulated signal (SI) and said internal oscillation signal (II) and generates a phase difference signal (ε) representing a phase difference between said angle-modulated signal (SI) and said internal oscillation signal (II); and
- a frequency control unit (83) which generates said control signal controlling an oscillation frequency of said internal oscillation signal (II) so that the phase difference represented by said phase difference signal approaches zero, and outputs said control signal as a demodulated signal;
- wherein each of said signals is a digital signal whose value indicates a substantial instantaneous value of the signal.

13. A method of demodulating an angle modulated signal comprising:
- an oscillating step (84, 85) of inputting a control signal designating an oscillation frequency thereto and generating an oscillation signal having the oscillation frequency designated by said control signal;
- an arithmetic step (82) of inputting an angle-modulated signal (SI) and said oscillation signal (II) thereto and generating a phase difference signal (ε) representing a phase difference between said angle modulated signal and said oscillation signal; and
- a frequency control step (83) of generating said control signal which controls an oscillation frequency of said internal oscillation signal so that the phase difference represented by said phase difference signal approaches zero;
- wherein:
  - said oscillating step comprises the steps of:
    - inputting the control signal (ω) designating the oscillation frequency thereto, and
    - generating the oscillation signal (II) having the oscillation frequency designated by said control signal and a second ninety-degree phase shifted signal (IQ) which is substantially ninety degrees out of phase with respect to said oscillation signal,
  - said arithmetic step comprises the steps of:
    - inputting an angle-modulated signal (SI) and generating a first ninety-degree phase shifted signal (SQ) which is substantially ninety degrees out of phase with respect to said angle modulated signal (SI), and
    - generating a difference signal (ε) representing a difference between a product of said angle-modulated signal and said second ninety-degree phase shifted signal and a product of the oscillation signal and said first ninety-degree phase shifted signal, and
  - said frequency control step comprises the steps of:
    - generating said control signal (ω) so as to control said difference signal (ε) indicating zero, and outputting said control signal as a demodulated signal.

14. The method of demodulation according to claim 13, wherein said phase shifting step substantially converts said angle-modulated signal by means of a Hilbert transform to generate said first ninety-degree phase shifted signal (SQ).

15. The method of demodulation according to claim 13, wherein said frequency control step inputs said difference signal and controls said oscillation frequency so as to be substantially proportional to a sum of a value proportional to said difference signal and an integration value of said difference signal.

16. The method of demodulation according to claim 13, wherein said oscillation step further comprises the steps of:
- integrating said control signal so as to generate an integration signal; and
- generating said oscillation signal (II) having a phase designated by said integration signal and said second ninety-degree phase shifted signal (IQ) which is substantially ninety degrees out of phase with respect to said oscillation signal.

17. The method of demodulation according to claim 13, wherein said frequency control step outputs said control signal designating a value ω(n) obtained by equation 24 as an oscillation frequency, where each of $K_P$ and $K_I$ represents a predetermined constant, $\Sigma\epsilon$ represents a total sum of values of said supplied difference signal, a value ε(n) represents the value of the n-th supplied difference signal, and said oscillation step inputs said control signal and generates said oscillation signal whose phase is substantially equal to a value θ(n) expressed by equation 25, where $f_s$ represents a sampling frequency of said angle modulated signal, $$\omega(n)=\omega(n-1)+K_p\cdot\epsilon(n)+K_i\cdot(1/f_s)\cdot\Sigma\epsilon \qquad (24)$$

$$\theta=\theta(n-1)+(1/f_s)\cdot\omega(n-1) \qquad (25)$$

18. The method of demodulation according to claim 13, wherein each of said signals is a digital signal whose value represents a substantial instantaneous value of the signal.

* * * * *